(12) United States Patent
Hill et al.

(10) Patent No.: US 11,437,346 B2
(45) Date of Patent: Sep. 6, 2022

(54) PACKAGE STRUCTURE HAVING SUBSTRATE THERMAL VENT STRUCTURES FOR INDUCTOR COOLING

(71) Applicant: Intel Corporation, Santa Clara, CA (US)

(72) Inventors: Michael J. Hill, Gilbert, AZ (US); Leigh E. Wojewoda, Tempe, AZ (US); Mathew Manusharow, Phoenix, AZ (US); Siddharth Kulasekaran, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 918 days.

(21) Appl. No.: 16/025,710

(22) Filed: Jul. 2, 2018

(65) Prior Publication Data
US 2020/0006287 A1 Jan. 2, 2020

(51) Int. Cl.
| | |
|---|---|
| *H01L 21/00* | (2006.01) |
| *H01L 23/34* | (2006.01) |
| *H01L 25/065* | (2006.01) |
| *H01L 49/02* | (2006.01) |
| *H01F 27/08* | (2006.01) |
| *H01L 23/64* | (2006.01) |

(52) U.S. Cl.
CPC ....... *H01L 25/0652* (2013.01); *H01F 27/085* (2013.01); *H01L 23/34* (2013.01); *H01L 23/645* (2013.01); *H01L 28/10* (2013.01)

(58) Field of Classification Search
CPC ........ H01L 23/34; H01L 23/645; H01L 28/10
USPC ................... 257/705–707, 712–722; 438/122
See application file for complete search history.

(56) References Cited

U.S. PATENT DOCUMENTS

| | | | | |
|---|---|---|---|---|
| 9,230,944 | B1 * | 1/2016 | Lambert | H01L 21/4846 |
| 9,312,218 | B2 * | 4/2016 | Choi | H01L 25/105 |
| 9,515,003 | B1 * | 12/2016 | Fitzgerald | H01L 28/10 |
| 9,911,723 | B2 * | 3/2018 | Min | H01F 17/00 |
| 10,149,352 | B2 * | 12/2018 | Huang | H05B 6/6423 |
| | | | | 219/757 |
| 10,321,575 | B2 * | 6/2019 | Li | H05K 1/0306 |
| 2020/0015348 | A1 * | 1/2020 | Hill | H01L 21/486 |

* cited by examiner

*Primary Examiner* — Calvin Lee
(74) *Attorney, Agent, or Firm* — Essential Patents Group, LLP.

(57) ABSTRACT

Embodiments include a microelectronic device package structure having an inductor within a portion of a substrate, wherein the inductor is at least partially embedded within the substrate. One or more thermal vent structures extend through at least one of the substrate or a board attached to the substrate. The one or more thermal vent structures provide a thermal pathway for cooling for the inductor.

17 Claims, 19 Drawing Sheets

PACKAGE STRUCTURE HAVING SUBSTRATE THERMAL VENT STRUCTURES FOR INDUCTOR COOLING

TECHNICAL FIELD

Embodiments of the present description generally relate to the field of microelectronic packaging, and, more particularly, to microelectronic packages substrates having inductors, where the package substrate comprises thermal vent structures.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages which include high power devices. Package structures supporting such high-power devices need to possess mechanical and thermal properties that can manage high power device operational requirements. Integrated circuit dice associated with package structures may comprise a portion of a voltage regulator circuitry, where voltage and current requires precise control of current and voltage during operation. For example, a die, such as a processor die, may be on/within a package substrate, and may be electrically coupled to an embedded inductor within a package substrate.

Such inductors which are coupled with die circuitry may limit processor current level capabilities, in order to avoid thermally induced damage to the inductors caused by exceeding inductor current limits. This reduction in processor current levels results in reduced processor performance because the processor may be capping its current level, or time in a turbo mode to accommodate inductor current limits.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
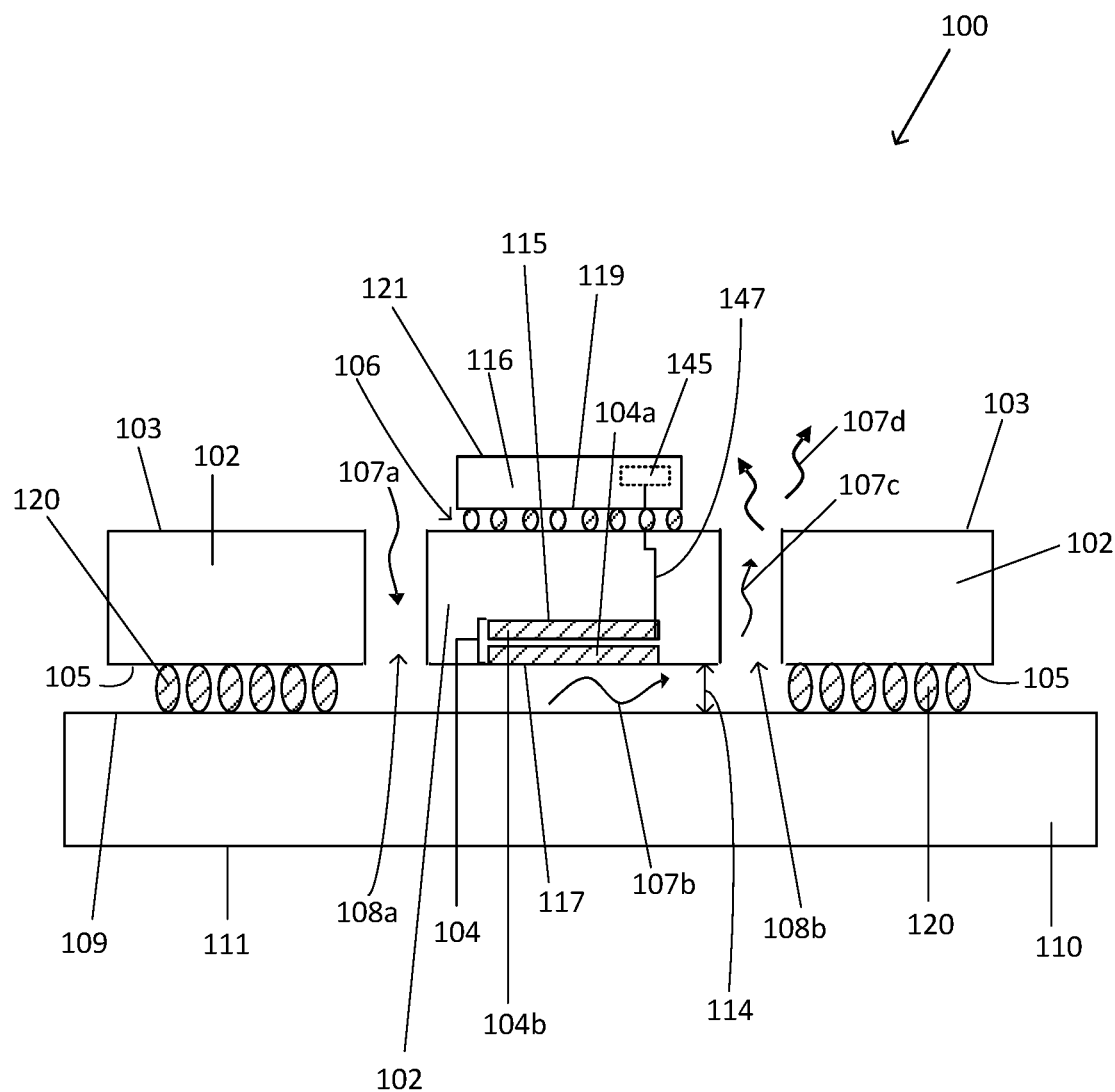
FIG. 1A illustrates a cross-sectional view of a package structure having thermal vent structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures having an inductor at least partially embedded in a substrate, and where a die, which may comprise an integrated circuit die, may be on a first side of the substrate. The inductor may comprise an air core inductor. In an embodiment, the air core inductor may comprise a series of conductive coils/windings, which surround a non-ferromagnetic material, such as a dielectric material, for example, and do not possess a ferromagnetic core material. The inductor described herein, may be electrically coupled to voltage regulator circuitry located in the die, where the die and the associated voltage regulator circuitry may comprise portion of a voltage regulator. In an embodiment, the voltage regulator may comprise a fully integrated voltage regulator (FIVR).

In an embodiment, a surface of the inductor is at least partially embedded within the substrate. A board, such as a motherboard, for example, may be coupled to the substrate. In an embodiment, at least one of the substrate or the board may comprise openings, such as thermal vent structures, which provide for cooling of the inductor. By incorporating the thermal vent structures into the substrate and/or the board, a temperature of the inductor may be cooled to allow larger currents and more power to be delivered to the die during peak current demand while the device is operational.

Some embodiments include a substrate with a die, which may be an integrated circuit die, where the die is on a first side of the substrate. An inductor may be at least partially on a second side of the substrate, opposite the first side of the substrate. The inductor may have a surface that is at least partially coplanar with the second side of the substrate, and may be at least partially embedded within the substrate. One or more thermal vent structures may extend through the substrate, in an embodiment, where the thermal vent structures comprise openings adjacent the inductor, which extends from the first side of the substrate through the second side of the substrate, in an embodiment. Additional thermal vent structures may extend through a first side and a second side of the board. The one or more thermal vent structures provide a thermal path for cooling the inductor with a fluid, such as air, for example.

FIG. 1A is a cross-sectional view of a package structure 100, arranged in accordance with some embodiments of the present disclosure, with a substrate having one or more openings, such as thermal vent structures, extending through the package substrate. The package structure 100 includes one or more dice 116 electrically and physically coupled to a first side 103 of a portion of a substrate 102. The substrate 102 may comprise a portion of a system in package substrate, a printed circuit board, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of die 116 and the substrate 102, in some embodiments. For example, interconnect structures may include routing structures such as pads or traces configured to receive electrical signals to and from devices that may be on or within the substrate 102. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete components and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like.

The die 116 may be an integrated circuit, or any other type of suitable die. In some embodiments, the die 116 may be any type of die which consumes a large amount of power, such as a die requiring more than 1 Watt to operate (such as a system on a chip) for example. Such die may generate a significant amount of heat, and may require sufficient cooling to maintain an acceptable operating environment, in order to avoid adversely affecting the operations of the die 116, and possibly neighboring die/components that may be adjacent the die 116 on the substrate 102.

The die 116 may be any type of integrated device or integrated component that may be included within an electronic device package. In some embodiments, the die 116 includes a processing system (either single core or multi-core). In some embodiments, the die 116 may be a microprocessor, a graphics processor, a signal processor, a network processor, a chipset, a memory device etc. In some embodiments, the die 116 be a system-on-chip (SoC) having multiple functional units (e.g., one or more processing units, one or more graphics units, one or more communications units, one or more signal processing units, one or more security units, etc.). The die 116 may comprise circuitry 145 related to voltage regulation, and may comprise circuitry to precisely control voltage supplied to the package structure 100, and to allow parts of the die 116 to be turned off or turned down to save power and to reduce the generation of heat.

In some embodiments, the die 116 may be attached to the first side 103 of the substrate 102 according to a variety of suitable configurations including a flip chip configuration, or any other suitable attachment configuration. In the flip chip configuration, a first side 119 of the die 116 may be an active side 119 of the die 116, and may be attached to the first side 103 of the substrate 102, using interconnect features 106, which may comprise such conductive features as bumps or pillars, which serve to route electrical signals, such as I/O, power and/or ground signals, associated with the operation of the die 116. In some embodiments, the wire bonding or the flip chip connections may comprise conductive materials such as copper, gold and nickel. A second side 121 of the die 116 is opposite the first side 119. The second side 121 of the die 116 may be coupled to a thermal solution, such as a heat sink, for example (not shown).

In an embodiment, solder interconnect structures 120, which are adjacent a footprint of the die 116, may electrically couple the second side 105 of the substrate 102 to a first side 109 of a board 110. In an embodiment, a standoff region 114 may be between the second side 105 of the substrate 102 and the first side 109 of a board 110. The solder interconnect structures 120 may comprise conductive materials such as solder materials, copper, gold and/or nickel. The solder interconnect structures 120 may comprise an array of ball grid array (BGA) structures disposed on the second side 105 of the substrate 102, and may be located in a peripheral portion of the substrate 102, adjacent to the die 116, in an embodiment. The board 110 may be a motherboard, a printed circuit board, or any other suitable type of board substrate 110, and wherein a second side of the board 111 may be opposite the first side of the board 109.

One or more inductors 104 may be at least partially embedded within the substrate 102, and may be located beneath the die 116 shadow, and within a die footprint. The inductor 104 may comprise a first side 117 and a second side 115. The inductor 104 may comprise any number of conductive layers (windings), such as a first conductive layer 104a and a second conductive layer 104b, for example. In an embodiment, the conductive layers 104a, 104b of the inductor 104 may comprise copper, or any other suitable conductive material. The inductor 104 may comprise an air core inductor (ACI) in an embodiment, and may comprise a portion of an integrated voltage regulator, such as a FIVR, for example. The second conductive layer 104b may be completely, or at least partially, embedded within the substrate 102, while the first conductive layer 104a may be at least partially exposed to the ambient environment. In an embodiment, the inductor 104 may be within the footprint of the die 116. The inductor 104 may be electrically coupled to die 116 voltage regulator circuitry 145 by electrical/signal trace 147 that is within the package substrate 102. The signal trace 147 is depicted as a single signal trace, however the signal trace 147 may comprise any suitable number of signal traces comprising any routing geometry, and may be located in any suitable location within the substrate 102. The signal trace 147 may comprise a conductive material such as, but not limited to, copper and/or copper alloys, for example. In an embodiment, the die 116 and the inductor 104 comprise a portion of a FIVR.

Figure 1B:
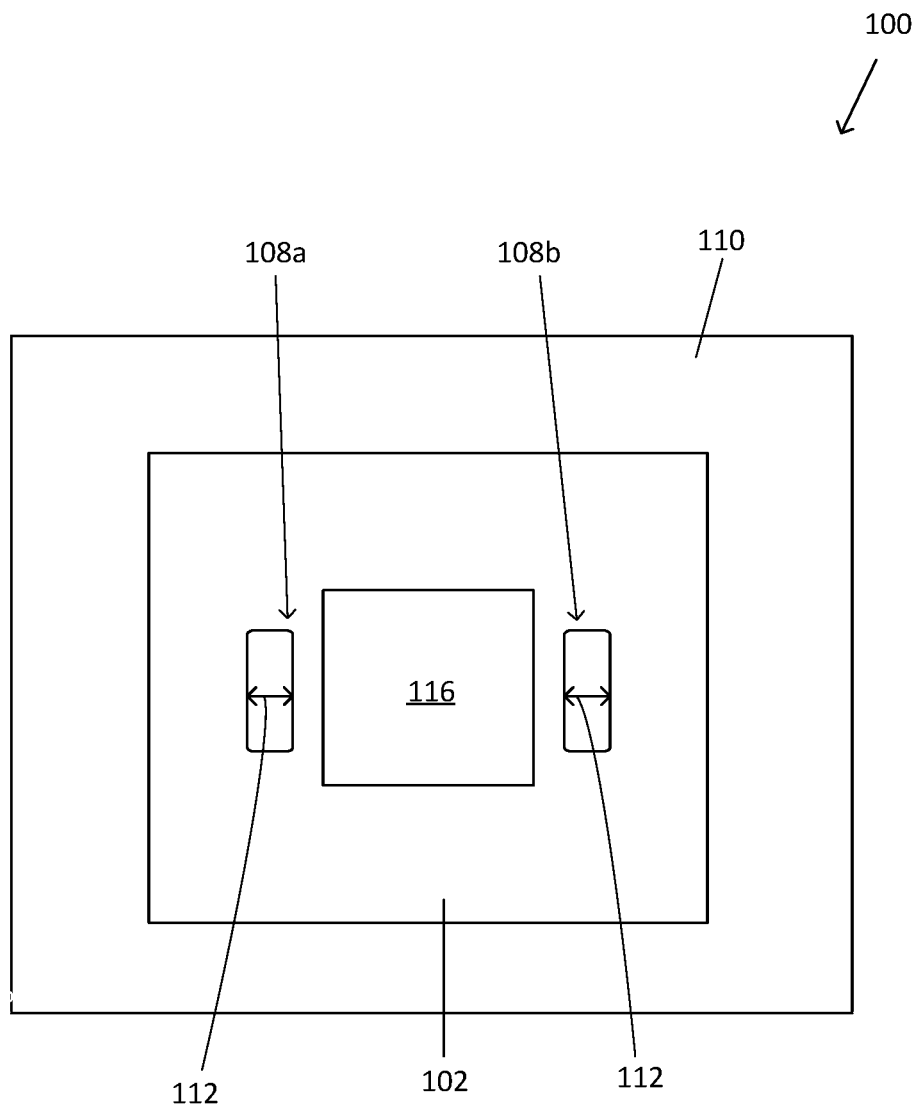
FIG. 1B illustrates a top view of a package structure having thermal vent structures, according to embodiments.
Figure 1C:
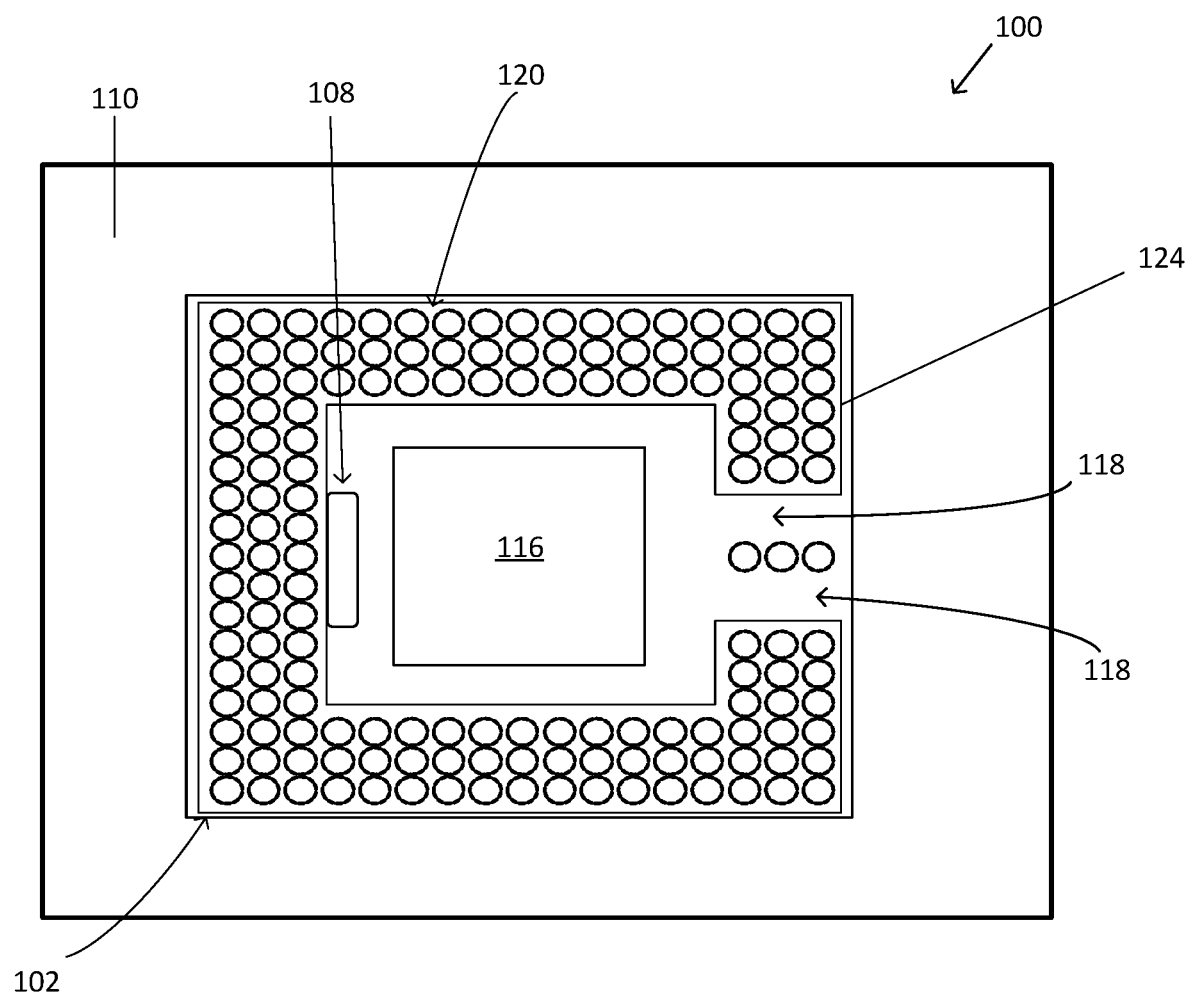
FIG. 1C illustrates a top view of a package structure having interconnect exit channels, according to embodiments.
Figure 1D:
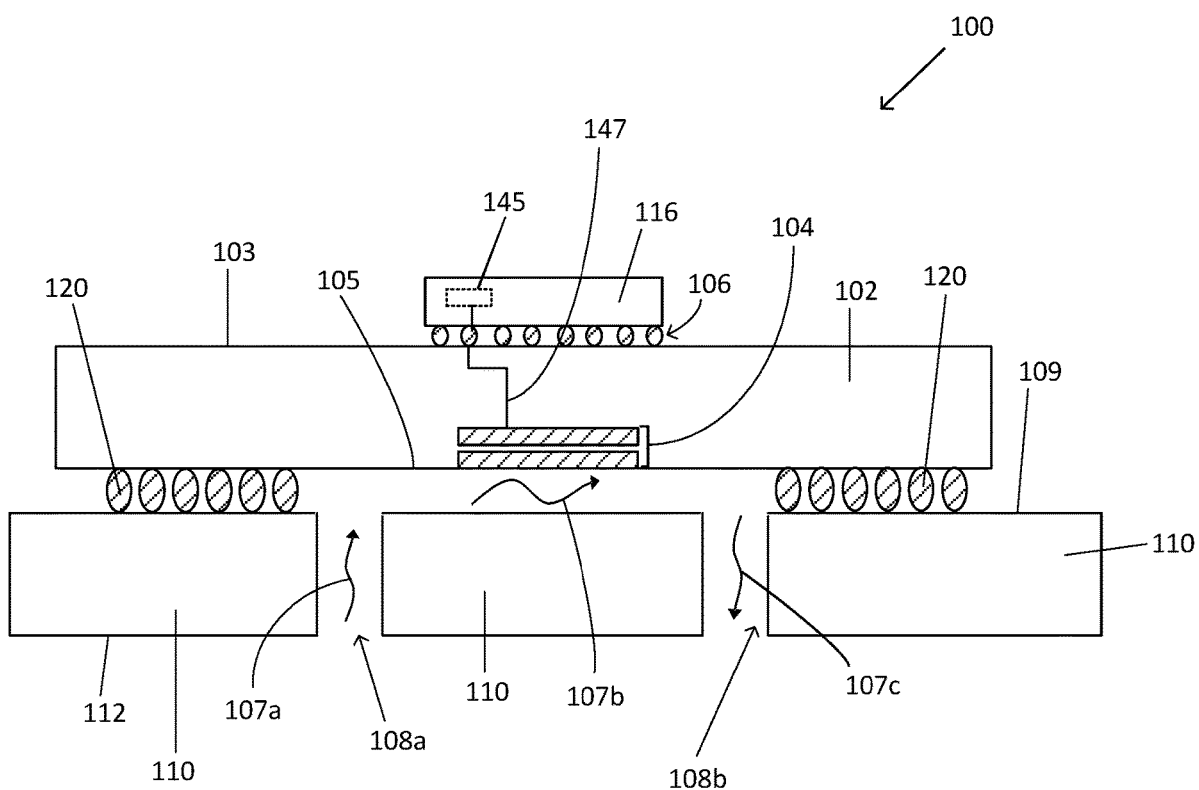
FIG. 1D illustrates a cross-sectional view of a package structure having thermal vent structures, according to embodiments.
Figure 1E:
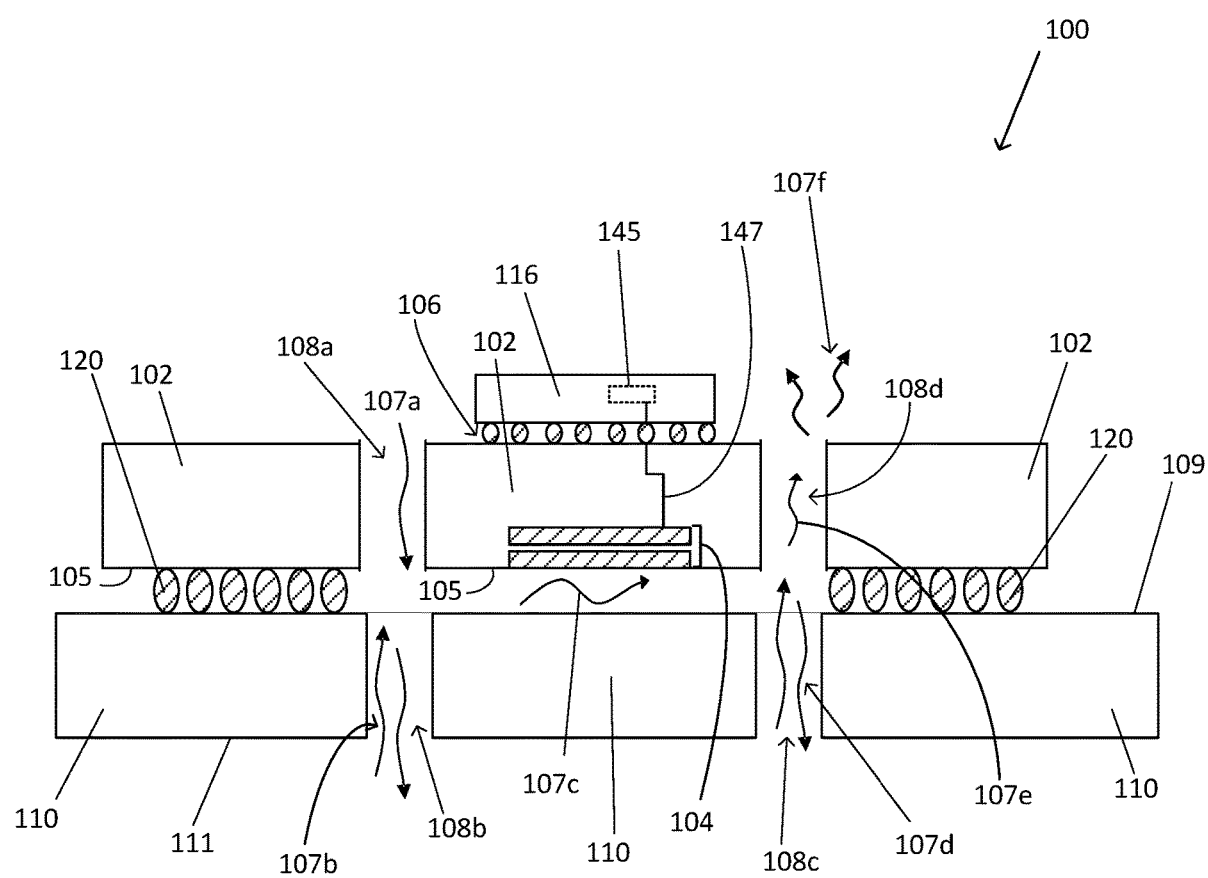
FIG. 1E illustrates a cross-sectional view of a package structure having thermal vent structures, according to embodiments.
Figure 1F:
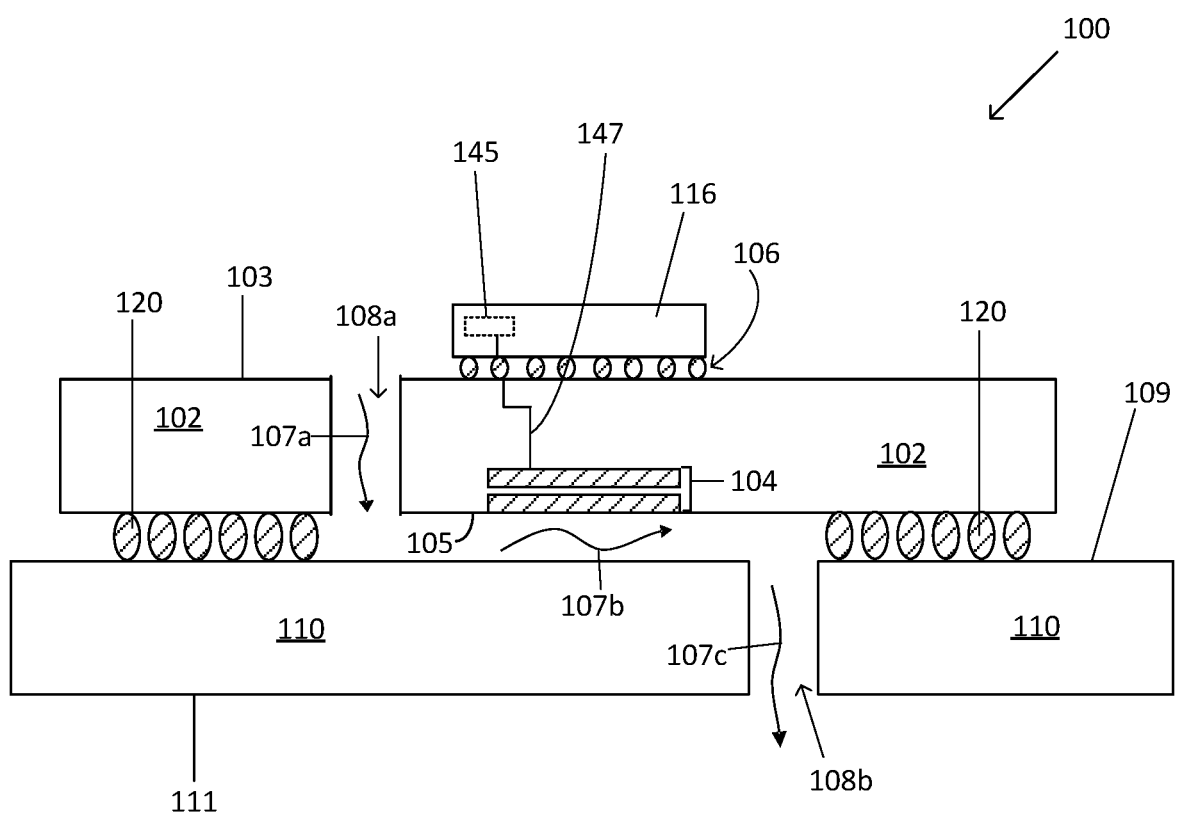
FIG. 1F illustrates a cross-sectional view of a package structure having thermal vent structures, according to embodiments.
Figure 1G:
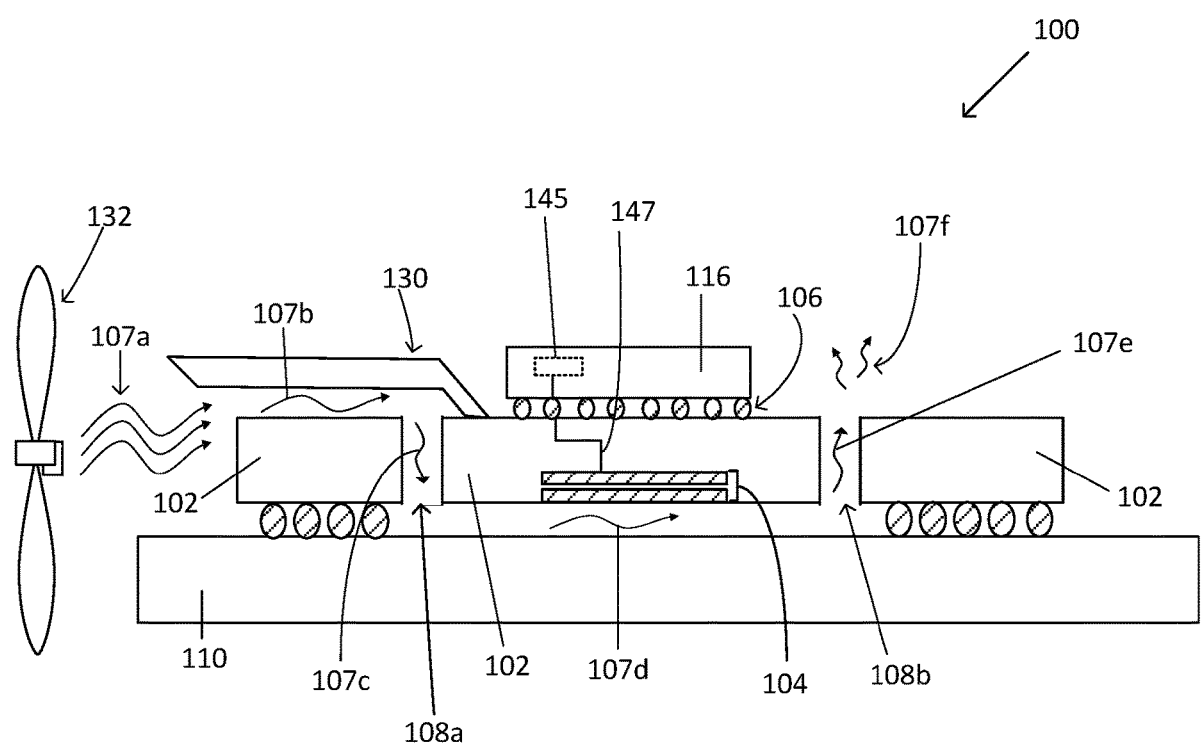
FIG. 1G illustrates a cross-sectional view of a package structure having thermal vent structures, according to embodiments.
Figure 1H:
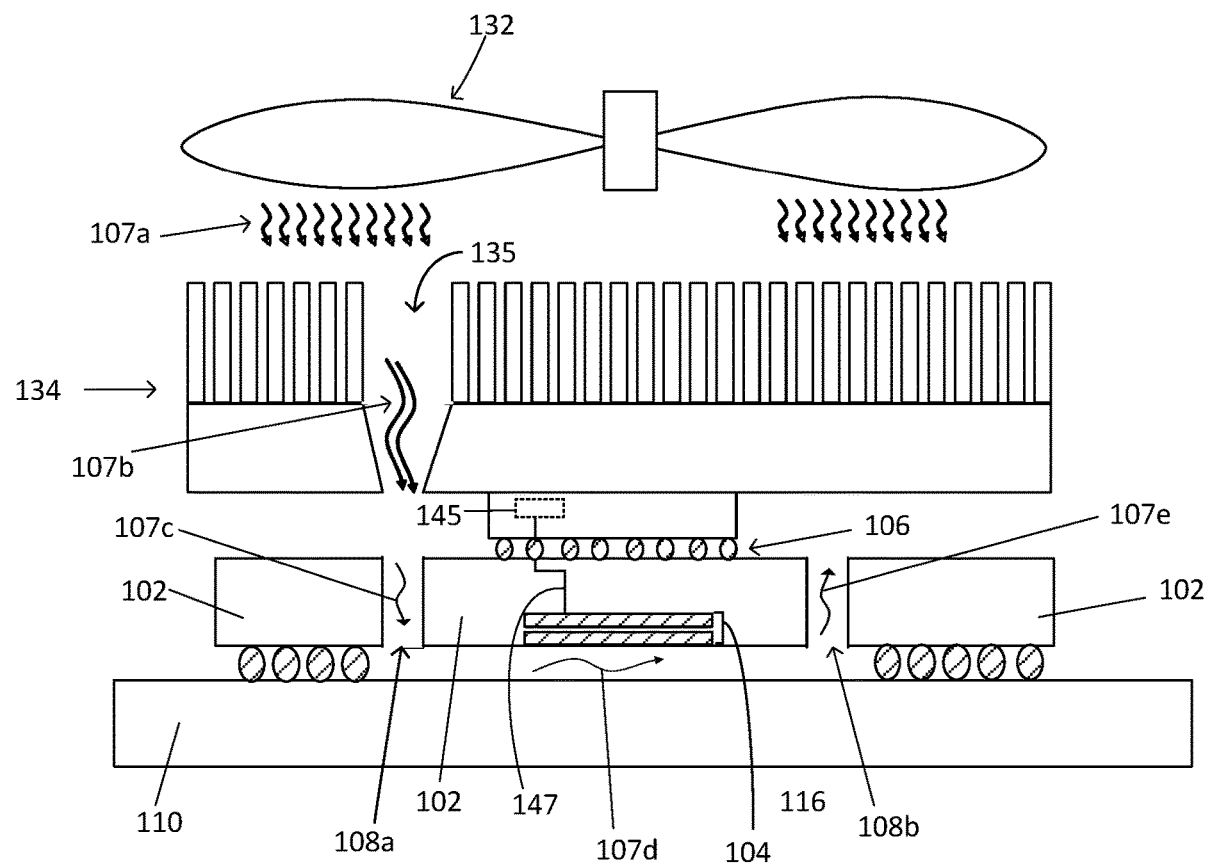
FIG. 1H illustrates a cross-sectional view of a package structure having thermal vent structures, according to embodiments.
Figure 1I:
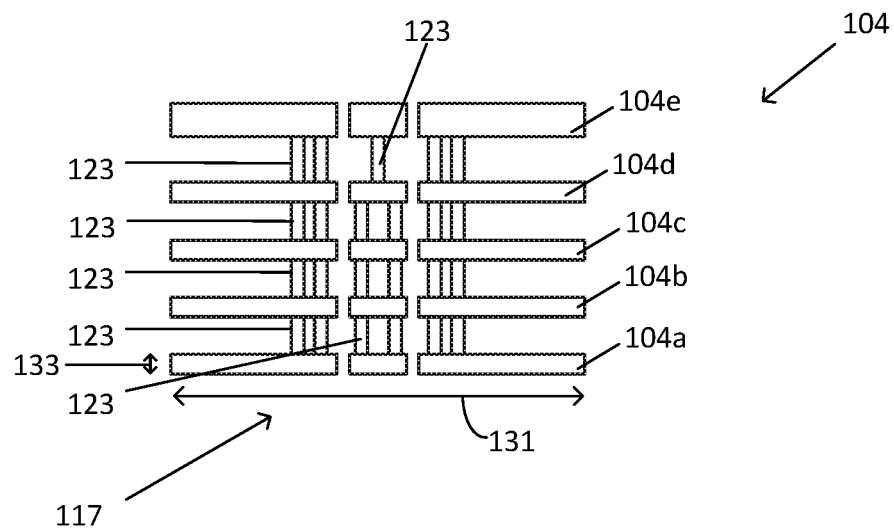
FIGS. 1I-1K illustrates a cross-sectional view, and side perspective views, respectively, of inductor structures, according to embodiments.
Figure 1J:
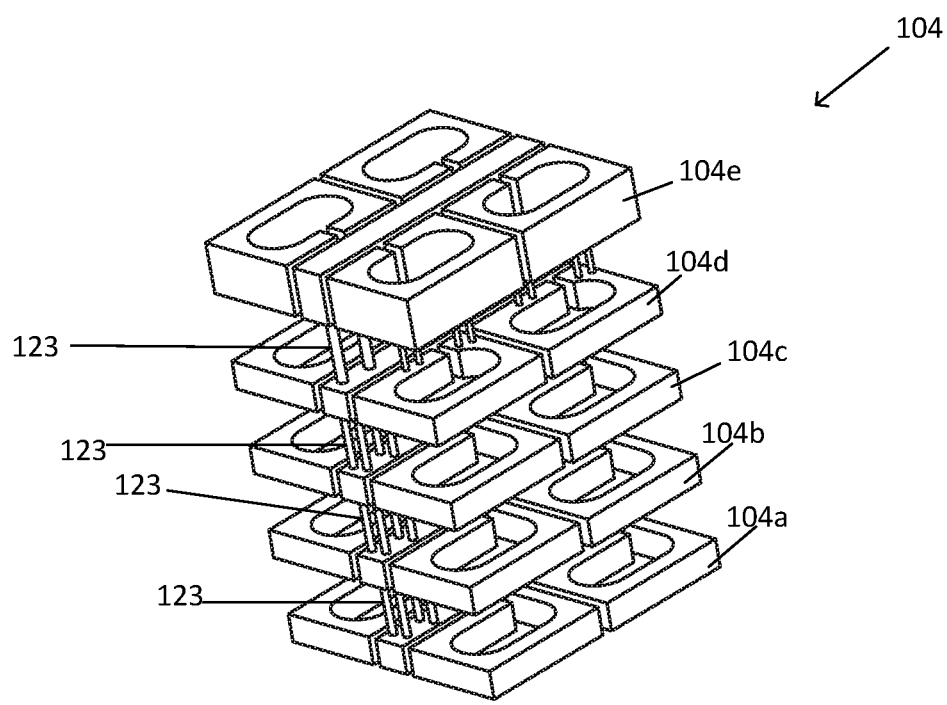
Figure 1K:
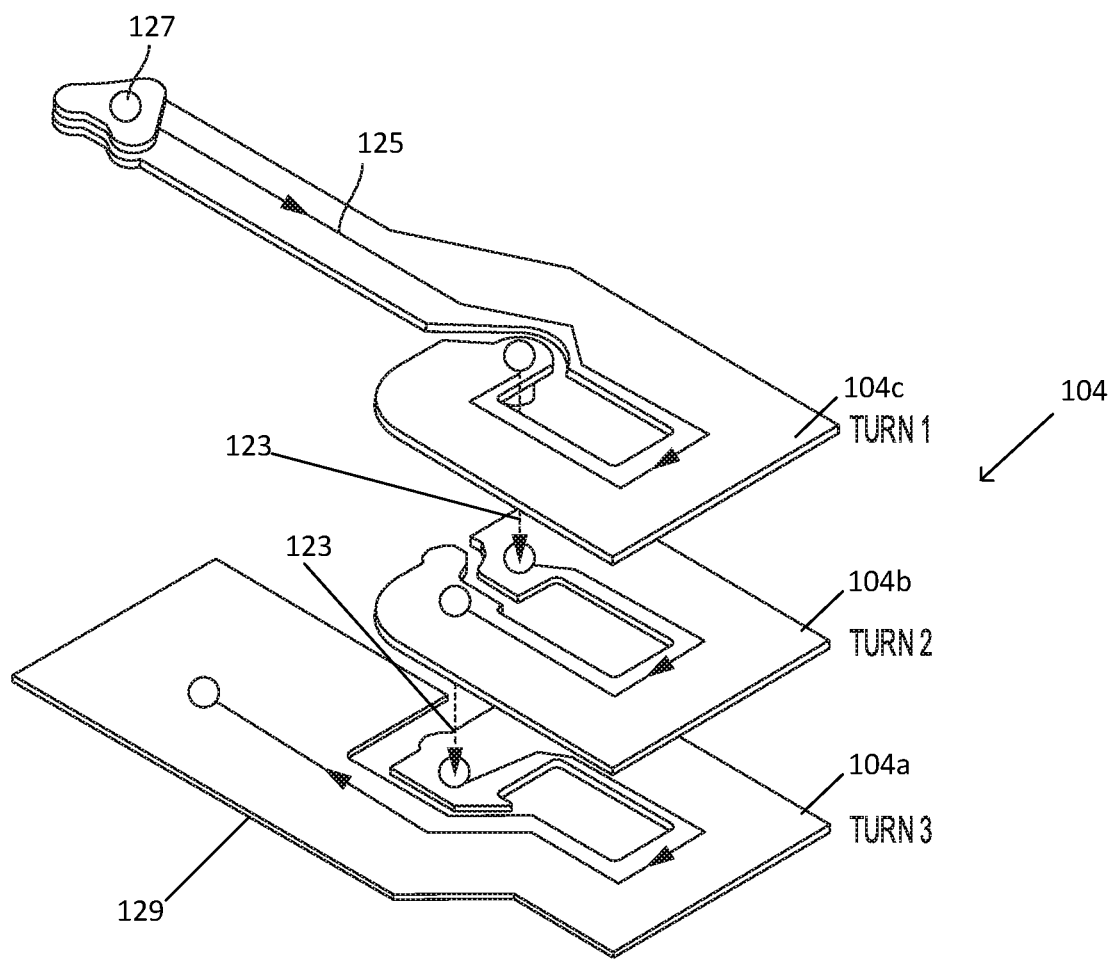

FIGS. 1I-1K depict embodiments of an inductor. In FIG. 1I (cross-sectional view), an inductor 104 comprises five conductive layers 104a, 104b, 104c, 104d, 104e. In an embodiment, the conductive layers 104a-104e may comprise windings of an ACI, which may be connected in series, such that the output of one layer is the input of the next. Conductive via structures 123 physically and electrically couple each of the individual layers 104a-104e to each other. In an embodiment, the conductive via structures 123 may comprise materials such as copper, for example. In some embodiments, the inductor 104 may comprise any number of conductive layers, and may comprise any number of via structures 123 coupling individual conductive layers to each other. In an embodiment, a first side 117 of the first conductive layer of the inductor 104a (which may comprise a first side 117 of the inductor 104 of FIG. 1A, for example) may comprise a length 131, and a width 133. The length 131 and width 133 may vary according to the particular design of the inductor 104, and in some embodiments, a particular inductor 104 may comprise a variety of shapes, such as a circular shape, or an irregular shape, for example.

FIG. 1J depicts a side perspective view of an embodiment of an inductor 104, wherein each of the individual layers 104a-104e are physically coupled to each other by the via structures 123, where the via structures 123 are substantially perpendicular to the orientation of the individual layers 104a-104e of the inductor 104. FIG. 1K depicts a side perspective view of an embodiment of inductor structure 104, where the inductor 104 comprises conductive layers 104a, 104b, 104c, which may comprise turns of the inductor (turn 1, turn 2, turn 3, for example.) The inductor 104 conductive layers may comprise copper, or any suitable conductive material, and may be coupled to each other by one or more via structures 123, which are orthogonal to the plane of the conductive layers 104a-104c. A direct current (DC) current path 125 flows from a switch node located on the die 116, through the conductive layers 104a-104c. The conductive layer 104c is electrically coupled to the switch node connection 127. An output plane 129 may be coupled to the inductor 104 by an inductor conductive layer, such as layer 104a, where the output layer 129 may be connected to any suitable load, such as to a capacitor or another type of suitable load, in some embodiments. The inductor 104 and the die 116 comprise portions of a voltage regulator circuit, such as a FIVR circuit, in an embodiment.

Returning back to FIG. 1A, one or more openings 108, which may comprise thermal vent structures 108a, 108b, for example, may extend completely through the substrate 102, and may be adjacent the inductor 104, in an embodiment. The one or more openings 108a, 108b provide a thermal pathway 107 for cooling the inductor 104. For example, a flow 107a of a fluid, such as air, for example, (or any other suitable fluid), may be applied through the vent structure 108a. The fluid flow 107a may be provided by a fan, ambient air, or any other suitable method. The fluid flow 107a may travel initially through the first vent structure 108a, and then may travel across the exposed surface 117 of the inductor 104 depicted as fluid flow 107b), where the inductor 104 may transfer heat to the fluid 107b. Fluid flow 107c may then travel though the second vent structure 108b, and make its way to the ambient environment, depicted as the flow 107d as it exits through the vent structure 108b. As the cooling flow 107b travels across the inductor 104, it removes heat from the inductor 104 and the heat is ejected/removed out through the second vent structure 108b. In other embodiments, the fluid 107 may flow in an opposite direction, for example, by entering from 108b and exiting through 108a.

In an embodiment, the one or more thermal vent structures 108a, 108b may be adjacent to the solder interconnect structures 120. In an embodiment, a portion of the standoff region 114 beneath the inductor 104 may be free of solder interconnect structures 120. The thermal vent structures 108a, 108b possess the ability to draw heat away from the one or more inductors 104, and direct the heat to the ambient environment, thus cooling the one or more inductors 104, and allowing the die 116 to operate at higher current levels and/or for longer periods of time.

By providing cooling to the inductor 104, the inductor can be used with larger currents, allowing more power to be delivered to the die 116 (which may comprise one or more processors). Higher operational current levels enable a processor, such as a CPU of a microelectronic device, to increase performance. The total current that may be passed through an inductor, as described herein, is thus increased by the implementation of the thermal vent structures, and the inductor is protected from being damaged by excessive heat.

The embodiments described herein allow the CPU of a device to avoid throttling back by reducing current demand, and/or to avoid limiting the time the CPU is in a high current state. Both of these conditions, throttling back or limiting time, lead to product performance reductions, because the CPU is capping its current or time in a turbo mode, for example, in order to accommodate the inductor current limits. The various embodiments included herein enable the inductor temperature to be maintained at acceptable levels during peak current demand.

FIG. 1B depicts a top view of a package structure 100. Vent structures 108a, 108b are adjacent the die 116, where the die 116 is on the substrate 102. The vent structures 108a, 108b may be placed adjacent the inductor 104 (not shown), which is underneath a die 116 shadow, in any convenient location adjacent to the die 116. The one or more vent structure openings 108a, 108b may comprise a width 112, which may vary according to design requirements of a particular device application.

FIG. 1C depicts a top view of a package structure 100, where a die 116 is electrically and physically coupled to a first side of a substrate 102. The substrate 102 may comprise a plurality/array of solder interconnect structures 120, such as ball grid array interconnect structures 120 for example, on a second side 105 of the substrate 120 (such as is depicted in FIG. 1A, for example). The array of solder interconnect structures 120 may surround the die 116 on a peripheral portion of the second side 105 of the substrate 102 adjacent to a die footprint. At least one vent structure 108 may be adjacent, and in between, the array of solder interconnect structures 120 and the die 116.

At desired locations, according to particular design parameters, exit channels 118 may be formed/patterned within the plurality/array of interconnect structures 120, to provide an exit channel for a cooling fluid flow, such as cooling fluid 107 of FIG. 1A, for example. The exit channels 118 are regions within the peripheral region of the second side 105 of the substrate 102 where there is an absence of interconnect structures 120. In an embodiment, an array of solder balls 120 surrounds the die 116 on a first portion 124 of a peripheral region of the second side 102 of the substrate, and at least one second portion 118 of the second side 105 of the substrate 102 is free of the solder balls. A fluid flow may be directed across the inductor, and may exit to the ambient environment through the exit channels 118, thus providing a cooling mechanism for the inductor 104, in an embodiment. By employing exit channels 118 (which may be strategically located within a solder interconnect array 120) the inductor may be cooled, thus resulting in CPU performance enhancement. In an embodiment, any of the configurations of vent structures 108 incorporated in the package structures shown herein may be employed with the exit channel structures 118. In other embodiments, the exit channels 118 may be employed without the incorporation of vent structures 108 within a package structure.

In FIG. 1D, a package structure 100 is depicted, where vent structures 108a, 108b, are extending through the motherboard 110, and there are no vent structures located within the substrate 102. The inductor 104 may be electrically coupled to die 116 voltage regulator circuitry 145 by electrical/signal trace 147 that is within the package substrate 102. A cooling fluid flow 107a may be directed from below the board 110 up through the first vent structure 108a, the fluid 107b may then travel across the surface of the inductor 104, and then the fluid 107c may travel out to the ambient environment through the second vent structure 108b, in an embodiment. The air/fluid 107 transfers heat from the inductor 104 into the ambient environment through one or more of the vent structures 108a,108b, according to a particular design requirements. The cooling fluid flow 107 may be generated in any number of ways, such as by a fan, a cooling apparatus such as a cooling plate or by any other appropriate means, and may comprise any appropriate type of cooling fluid.

FIG. 1E depicts another embodiment of a package structure 100, where the one or more vent structures 108 are located through both the substrate 102 and through the board 110. The inductor 104 may be electrically coupled to die 116 voltage regulator circuitry 145 by electrical/signal trace 147 that is within the package substrate 102. In an embodiment, a fluid 107a may flow through a first vent 108a, across 107c the inductor 104, and may exit through one or both of vent 108c or vent 108d. In another embodiment, the flow 107 may enter through the vent structure 108d within the substrate 102, may pass across the inductor 104 (and also may pass across the first surface of the board 109) and then may pass into the ambient through one or both of vent structures 108b or 108a. In yet another embodiment, the cooling flow 107 may enter or exit through any of the vents 108a-108d, and may carry heat transferred from the inductor 104 to the ambient environment.

In FIG. 1F, a package structure 100 is depicted, where an L-shaped fluid pathway is shown, wherein the cooling flow 107a may travel from the substrate 102 through the vent structure 108a, across (107b) the inductor 104, and then down 107c through the motherboard vent structure 108b, in an embodiment. The inductor 104 may be electrically coupled to die 116 voltage regulator circuitry 145 by electrical/signal trace 147 that is within the package substrate 102. The L-shaped fluid pathway may initiate on either side of the inductor 104, and may initially flow through substrate 102, across the inductor 104, and then out through the board 110, or may enter through the board and then out through the substrate 102. Thus, the inductor 104 may be cooled by providing a cooling flow generated above the substrate 102, and/or by cooling flow generated from or initiated at/through the board 110.

In FIG. 1G, an embodiment of a package structure 100 is depicted, where an air funnel 130 is coupled with the package structure 100. The inductor 104 may be electrically coupled to die 116 voltage regulator circuitry 145 by electrical/signal trace 147 that is within the package substrate 102. The air funnel 130 may comprise an apparatus that draws/directs cooling fluid, such as air for example, onto the substrate 102, thus cooling the package structure 102. In an embodiment, the air funnel 130 may be thermally coupled to the substrate 102 and the inductor 104, and may be thermally coupled to any appropriate component/device, such as the die 116, for example. In an embodiment, the air funnel 130 may direct a cooling airflow 107a towards the substrate 102, which may be generated by a fan 132, where the fan 132 may be associated/coupled with the package structure 100, which may comprise a portion of a microelectronic device, such as a portion of a mobile handheld device for example. In an embodiment, the cooling flow 107a, 107b is depicted as flowing (107c) through the vent structure 108a, across (107d) the inductor 104, thus cooling the inductor 104, and then heat transferred from the inductor 104 may exit (107e, 107f) through the vent 108b. In some embodiments, the air funnel 130 may be incorporated with vent structures that may be located within the motherboard 110 (such as those depicted in FIG. 1D), or with any combination of vent structures (and/or exit channels) located within both the substrate 102 and/or the board 110

FIG. 1H depicts a package structure 100 incorporating vent structures 108a, 108b coupled with a heat sink 134. The inductor 104 may be electrically coupled to die 116 voltage regulator circuitry 145 by electrical/signal trace 147 that is within the package substrate 102. The heatsink 134 may comprise any suitable shape or size of a heat solution, which may serve to draw heat from the package structure 100, thus cooling the package structure 100, as well as cooling the inductor 104. In an embodiment, the heatsink 134 may be attached and thermally coupled to the second side of the die 116. Thermal interface material (not shown) may be between the heatsink 134 and the second side of the die 116. In an embodiment, the heatsink 134 may comprise at least one opening 135, where a cooling fluid 107a flow may be generated from a fan 132. The fluid 107b may travel through the heatsink 134 opening 135, through a vent structure opening 108a (107c) in the substrate 102, may travel across the inductor 104 (107d), and then may exit (107e) though the vent structure 108b. The vent structures may be located in either the substrate 102 and/or the board 110, in an embodiment.

In an embodiment, the fluid flow 107 which contains the heat transferred from the inductor 104 may be thermally transferred to the heatsink 134. In another embodiment the heat sink may comprise additional openings 135, which may further cool the inductor 104. In an embodiment, the fan 132 may generate the cooling fluid 107 flow from above the heatsink 134, or the fan 132 may generate the cooling fluid 107 flow from any desirable position relative to the vent structures 108. The cooling fluid 107 flow may be located in any desirable location for the purposes of providing a cooling flow to the inductor 104.

The thermal vent structures and solder interconnect exit channels provided herein enhance thermal dissipation within the package substrate 102, and for the package structures 100 in general. The embodiments herein provide additional thermal dissipation for a CPU, as well as provide for a reduction of DC resistance of the inductor, thus improving the performance of the CPU. The inductor structures 104 are capable of carrying increased current, and allow for increased current levels to be delivered to the CPU, which in turn increases CPU performance. The embodiments herein include adding thermal vent structures, which may comprise any suitable shape or size, and may be located within the substrate and or the board in any suitable location, adjacent to the inductor. The thermal vent structures and solder array exit channels provided herein are able to provide cooling flow across the inductor in order to draw the heat away from the inductor, thus reducing the overall inductor temperature and increasing the inductor current capacity.

Figure 2:
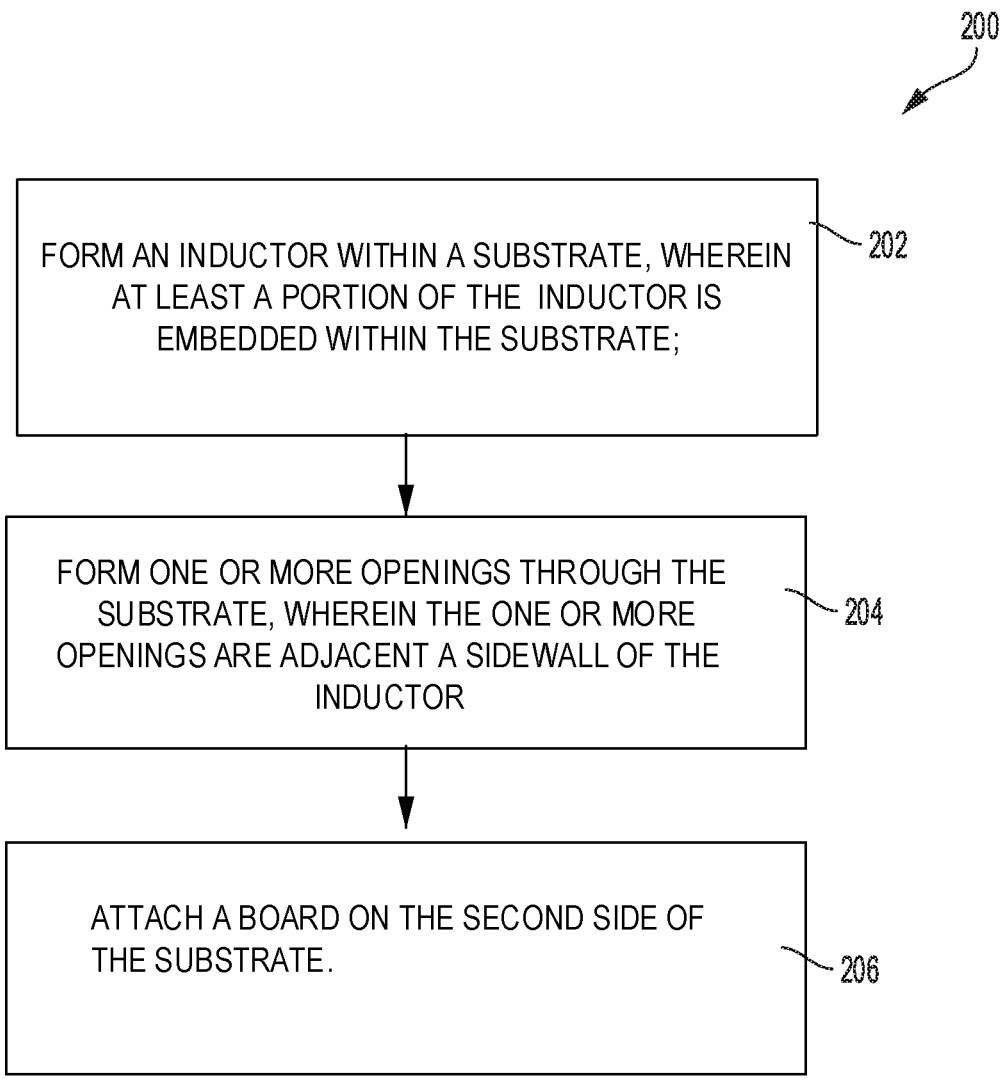
FIG. 2 is a flow diagram illustrating a method of fabricating package structures having thermal vent structures, according to embodiments.

FIG. 2 depicts a flow chart of an embodiment of a method 200 of forming thermal vent structures in at least one of a substrate or a board, where the substrate comprises an inductor at least partially embedded within the substrate. The substrate may comprise a die, where the die may include voltage regulator circuitry. The inductor is electrically coupled with the voltage regulator circuitry of the die, in some embodiments. The vent structures described herein enable the cooling of the inductor, and thus improve the performance of voltage regulator circuitry coupled to the die. The method 200 may share any or all characteristics with any other methods discussed herein, such as, but not limited to, the methods disclosed in FIGS. 3A-3I. For example, FIGS. 3A-3I may show cross-sectional views of structures employing any of the operations described in method 200. It should be noted that the order of the operations of method 200 may be varied, according to a particular application.

At operation 202, an inductor is formed within a substrate, where the inductor is at least partially embedded within the substrate. In an embodiment, a surface of the inductor is substantially coplanar with a surface of the substrate. The inductor may be formed within a recess of the substrate. A die, such as a processor die, may be attached (either initially or subsequently) to a first side of the substrate, opposite a second side of the substrate. The die may include any type of die, such as a processor die, or a memory die, for example, and may comprise voltage regulator circuitry. A recess may be formed in the second side of the substrate, in an embodiment. The recess may be formed by utilizing a dielectric etch, where a portion of the package substrate may be removed to accommodate the dimensions of the inductor. Any suitable removal process may be used to form the recess, such as an etching process, for example. An inductor may be formed within the recess of the second side of the substrate. The inductor may comprise any number of conductive windings/layers, in an embodiment.

In an embodiment, the inductor may be formed to comprise any number of conductive layers, where the layers of conductive material may be formed within the recess. The conductive layers of the inductor may be formed utilizing such processes as plating process, and/or physical vapor deposition processes, for example. The conductive material, such as copper for example, may be patterned and etched using any suitable lithographic techniques, such as laser etching or drilling processes, for example to form the inductor windings.

Conductive via structures may be formed between each successive conductive layer, and may electrically physically couple each inductor layer with each other. The conductive via structures may be formed of any suitable conductive material, such as copper, for example, and may be formed utilizing any suitable known patterning and etching techniques, such as, but not limited to, photolithographic methods, for example. A first surface of the inductor is formed such that it is substantially coplanar with the second side of the substrate, such that the first layer of the inductor is exposed and partially external to the package substrate. A second surface of the inductor is at least partially embedded within the package substrate material. The conductive layers of the inductor may comprise a conductive material such as a metal, and may include copper, aluminum or gold, for example, and may be in the shape of pillars or lands, in some cases. A plurality of interconnect features may be formed adjacent to the inductor, on the second surface of the substrate. The plurality of interconnect features may comprise conductive bumps, such as C4 bumps or balls, or wire structures, in some embodiments. The plurality of interconnect features may be formed in any variety of manners, such as, but not limited to plating processes, printing and reflow processes or wire bonding, for example.

The inductor may be an ACI inductor in an embodiment, and in other embodiments, the inductor may comprise any suitable type of inductor for a particular application. Conductive traces may be formed within the package substrate with which to couple the inductor to a die. In some embodiments, more than one die may be attached to the first side of the substrate. The conductive traces may couple the inductor to portions of a voltage regulator circuitry that may reside within the die. The inductor may comprise a portion of the voltage regulator circuitry. The inductor may comprise a portion of a FIVR circuitry, in some embodiments.

At operation 204, one or more openings, such as thermal vent structures, may be formed through the substrate. In an embodiment, the one or more thermal vent structures are formed adjacent to a sidewall of the inductor. The one or more thermal vent structures may comprise a width. In an embodiment, the width may comprise, but is not limited to, between about 300 microns and about 600 microns. The one or more thermal vent structures may be formed in any suitable location through the substrate, adjacent a sidewall of the inductor. The vent structures extend through the first side of the substrate and through the second side of the substrate, thus the opening is completely through the substrate. The vent structures/openings may be formed by utilizing a drilling process, such as a laser drilling process, or any other suitable removal process, in some embodiments. The width and location of the thermal vent structures may be tailored to suit a particular application, in order to optimize a particular amount of cooling that may be desired for the inductor.

One or more solder ball interconnect structures may be formed adjacent the vent openings on the surface of the second side of the substrate. The interconnect structures may be formed in a peripheral region of the second side of the substrate. In an embodiment, the interconnect structures may comprise a plurality of solder balls formed within the peripheral region of the second side of the substrate. In an embodiment, a region of the plurality/array of interconnect structures may be free of interconnect structures, where the region that is free from the interconnect structures may comprise exit openings/channels, where the exit openings may comprise an additional cooling path for the inductor.

The exit openings may be formed by initially forming a plurality of solder balls, such as BGA solder balls, surrounding the periphery of the die. Exit channels may be defined by removing appropriate sections of solder balls, to form the exit channels. Alternatively, areas on the second side of the substrate, adjacent the die, may be masked prior to solder ball formation, in order to form exit channels in desired locations adjacent to the inductor. The exit channels provide a pathway for a cooling fluid to exit the package structure after heat transfer has occurred with the inductor. For example, a cooling fluid may flow from either a vent opening from the substrate, and/or a vent structure/opening in a board attached to the substrate, and may flow across the inductor, where the inductor may transfer heat to the cooling fluid. The fluid containing the heat from the inductor may then exit the package structure through one or more of the exit channels. The exit channels/pathways provide a route through which heat transferred from the inductor to a cooling fluid, such as air for example, may escape into the ambient environment.

At operation 206, the substrate comprising the openings may be physically attached to a board, where the sidewalls of the thermal vent structures are placed on the surface of the board. In an embodiment, the board, such as a motherboard or a printed circuit board, for example, may comprise thermal vent structures in any suitable location, which may be formed using drilling processes, for example. In other embodiments, the board may not comprise thermal vent structures. The board vent structures may further provide a pathway for a cooling fluid to cool the inductor located within the substrate. The plurality of interconnect structures on the second side of the substrate may be adjacent the board thermal vent structures, and may electrically couple the substrate to the board. Optionally, the die may be attached subsequent to the attachment of the board to the substrate, or may be attached prior to the attachment of the substrate to the board.

The one or more thermal vent structures located through the substrate and/or through the board provide thermal cooling for an inductor thermally coupled with voltage regulator circuitry within a processor die attached to the substrate. The die may comprise a first side and an opposing second side, where the second side of the die may be attached to the first side of the substrate, opposite the inductor. The attached die may have a plurality of interconnect features, such as a plurality of solder balls, on the second side of the die, which may be an active side of the die, in some embodiments. The plurality of interconnect features may comprise metal, such as copper, aluminum or gold, for example, and may be in the shape of pillars or lands, in some cases. The plurality of interconnect features may be conductive bumps, such as C4 bumps or balls, or wire structures, in some embodiments. The plurality of interconnect features may be formed in any variety of manners, such as, but not limited to plating processes, printing and reflow processes or wire bonding, for example.

Figure 3A:
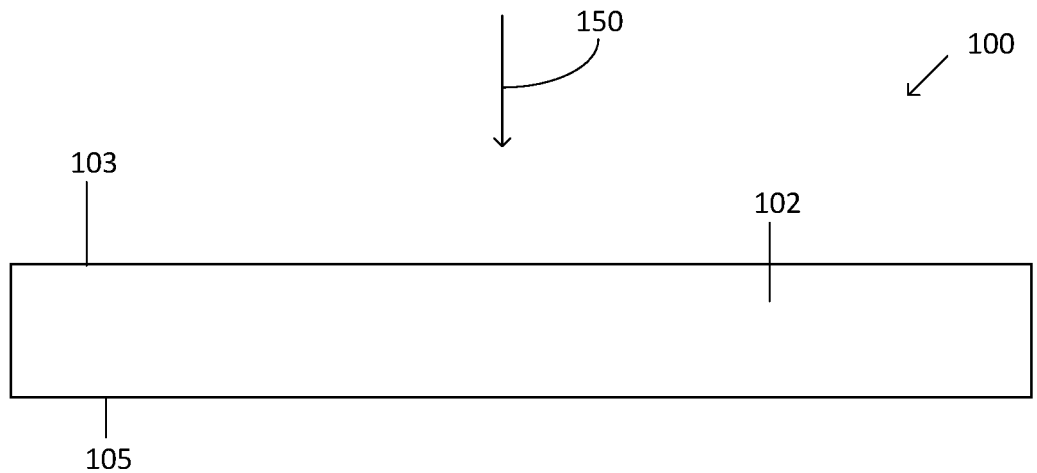
FIGS. 3A-3I illustrate cross-sectional views of package structures formed according to methods of fabricating package structures having thermal vent structures, according to embodiments.

FIGS. 3A-3I depict cross-sectional views of structures formed by employing a process of fabricating package device structures comprising thermal vent structures within at least one of a board or a substrate. The thermal vent structures provide cooling for a package embedded inductor, which enables higher current operation for a die/processor attached to the package structure. In FIG. 3A, a portion of a substrate is depicted. In an embodiment the substrate 102 may comprise a first side 103 and a second side 105. The substrate 102 may comprise a package substrate, in an embodiment. The substrate 102 may comprise a dielectric material with any number of conductive circuitry traces embedded therein. A recess (not shown) may be formed on the second side 105 of the substrate 102, by using any suitable recess formation process 150, such as an etching process, and/or a drilling process, for example.

Figure 3B:
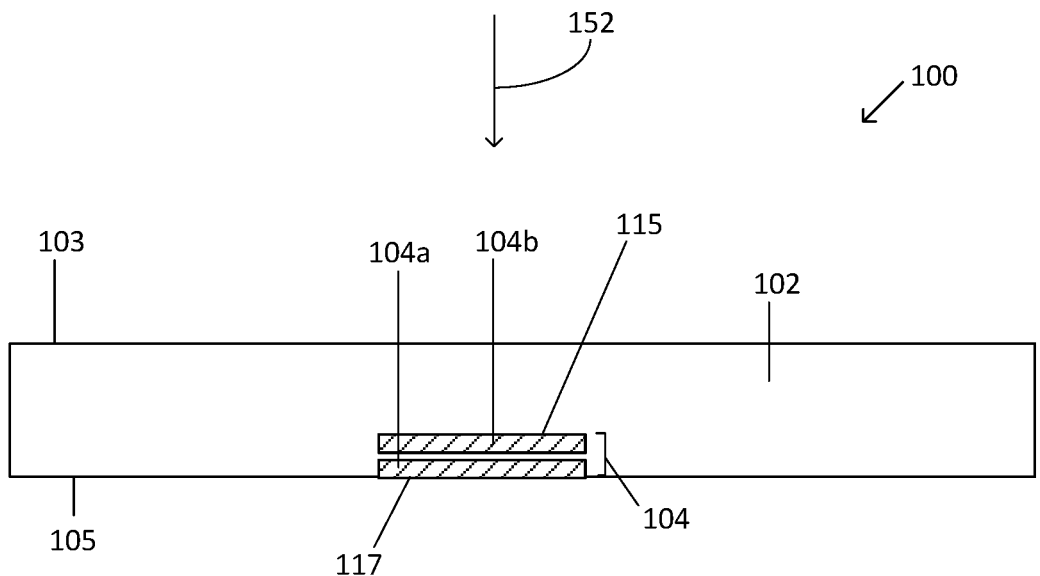

In FIG. 3B, an inductor 104, may be formed within the substrate 102, using any suitable inductor formation process 152. At least a portion of a surface/first side 117 of the inductor 104 may be exposed to the ambient environment, and/or may be substantially coplanar with the second side 105 of the substrate, in an embodiment. A second side 115 of the inductor 104 may be embedded within the substrate 102. In an embodiment, the inductor 104 comprises a first conductive layer 104a and a second conductive layer 104b. The conductive layers 104a, 104b of the inductor 104 may be formed by physical deposition and/or any suitable plating process, such as an electroplating process for example. The first conductive layer 104a may comprise a thickness and a width, which may vary according to the particular application. The second conductive layer 104b may comprise a thickness and a width that is the same thickness and width as the first conductive layer 104a of the inductor 104. In other embodiments, the first and second layers 104a, 104b may not be equal in thickness and width. In other embodiments, the inductor 104 may comprise any number of conductive layers.

Via structures (not shown), such as those depicted in FIG. 1I, for example, may physically and electrically couple the conductive layers 104a, 104b to each other. In an embodiment, the inductor 104 may comprise an ACI inductor, and may be a portion of a voltage regulator circuitry, which is electrically coupled through traces (not shown) located within the package substrate 102 to voltage regulator circuitry that is located within a die (not shown). The die may be subsequently attached to the first side 103 of the substrate 102. The inductor 104 may be within the footprint of a die, such as the die in FIG. 1A, for example.

Figure 3C:
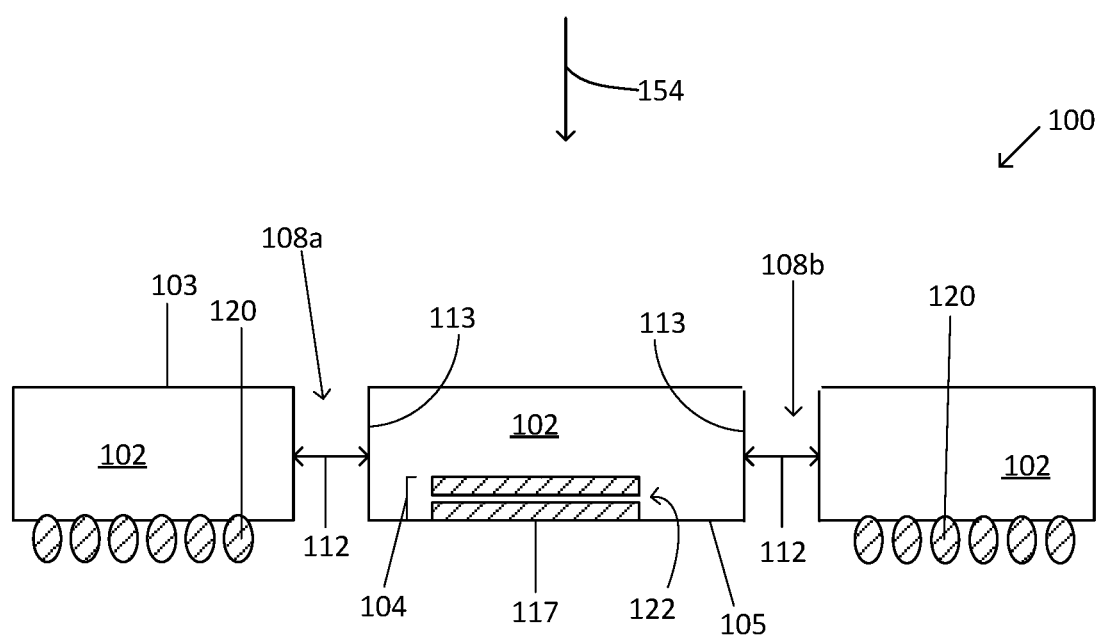

In an embodiment, solder interconnect structures 120 are attached to the second side 105 of the substrate 102, and may be adjacent to the inductor 104 (FIG. 3C). In embodiment, the solder interconnect structures 120 may be attached to the second side 105 of the substrate 102 by using a solder reflow process, for example.

Vent structures 108a, 108b, may be formed through the substrate 102, adjacent to the die 116, and adjacent to the inductor 104, by utilizing any suitable opening formation process 154. In an embodiment, vent structures/openings 108a, 108b may be formed by using any suitable etching process for example, as well as by using any suitable drilling process and/or any suitable laser process for example. In an embodiment, a sidewall 113 of the vent structures 108a, 108b may be adjacent a sidewall 122 of the inductor 104. In an embodiment a width 112 of the vent structures 108a, 108b may be optimized to allow for the required amount of cooling flow to be directed across the inductor 104, such that the temperature of the inductor 104 may be reduced by at least 3 to 4 degrees Celsius in an embodiment. In other embodiments, the temperature reduction of the inductor 104 may be as little as 1 degrees Celsius. The temperature reduction of the inductor may be optimized for a particular application by adding any number of vent structures 108 as required.

The locations of the vent structures 108a, 108b may be varied depending upon the design requirements for the particular package structure 100 that may be residing within a device, such as a microelectronic handheld mobile device for example. In an embodiment, the vent structures 108a, 108b provide a thermal pathway for heat generated by the inductor 104 to exit the package structure 100. The vent structures 108a, 108b provide a thermal path where a fluid can flow across the inductor 104 between the substrate 102 and a board. By creating one or more vent structures through the substrate 102, cooling is provided for the inductor 104. An existing CPU fan can provide a fluid flow, such as air, to be directed within the vent structures 108a, 108b in an embodiment, or a separate fan can be used to actively direct fluid flow into the vents 108a, 108b, and may be aided by component mounted funnels such as funnel 130 depicted in FIG. 1G, and/or by the heatsink 132 of FIG. 1G, in some embodiments.

Figure 3D:
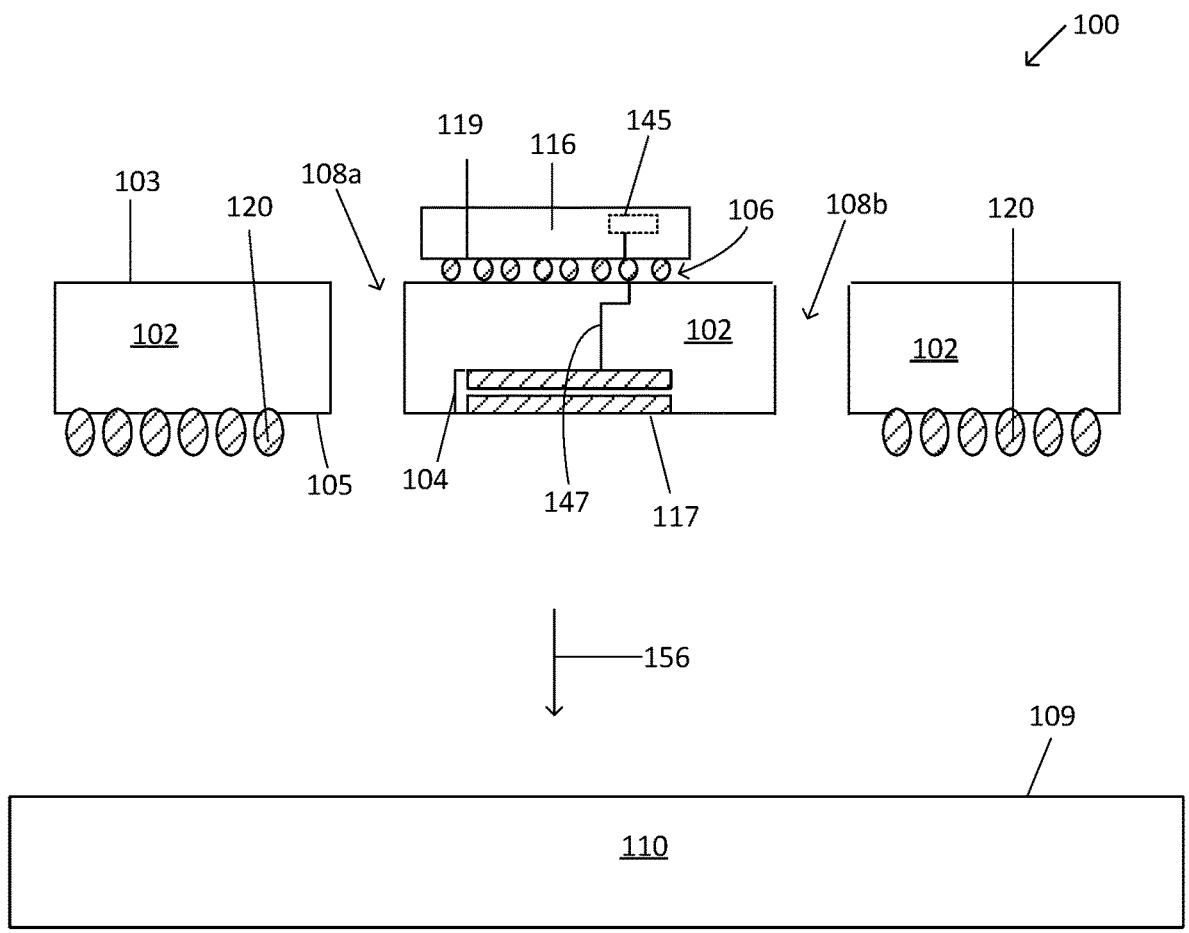

In FIG. 3D, a die 116 may be attached to the substrate 102. One or more interconnect structures 106 may be on the first side 119 of the die 116. The interconnect structures 106 may be formed by using solder materials, such as tin, silver, gold, nickel, for example in an embodiment. Other conductive materials may be used to form the interconnect structures. The interconnect structures 106 may comprise any shape, such as a spherical shape or a rectangular shape, for example. The interconnect structures 106 may be formed using metallization processing such as physical vapor deposition or plating processing. In an embodiment, the die 116 may be coupled to the first side 103 of the substrate 102, wherein the interconnect structures 106 are between the first side of the die 119 and the first side 103 of the substrate 102. In other embodiments, the die 116 may be attached subsequent to the substrate attachment to a board.

A board 110 may be provided, where the board 110 may comprise a motherboard or a printed circuit board, for example. The board 110 may be any suitable substrate with which to attach the package substrate 102 thereto, as needed for particular design requirements. An attachment process 156 may be applied to attach the board 110 to the substrate 102, where the second side 105 of the substrate 102 may be attached to a first surface 109 of the board 110. The substrate 102 comprises an embedded inductor 104, and die 116 on a side opposite the side of the substrate 102, where the inductor 104 is at least partially embedded. The inductor 104 may be electrically coupled to die 116 voltage regulator circuitry 145 by electrical/signal trace 147 that is within the package substrate 102. In an embodiment, any appropriate substrate attachment process 156 may be utilized, where the solder interconnect structures 120 may be attached by a reflow process, for example, to pads (not shown) on the first surface 109 of the board 110. The inductor 104 may comprise a surface 117 that is exposed, or at least partially exposed, to the ambient environment, where the surface 117 is between the second side 105 of the substrate 102 and the first side 109 of the board 110. In an embodiment, There may be a standoff region between the second surface 105 of the substrate 102 and the first side 109 of the board 110, subsequent to attachment of the board 110 to the substrate 102.

Figure 3E:
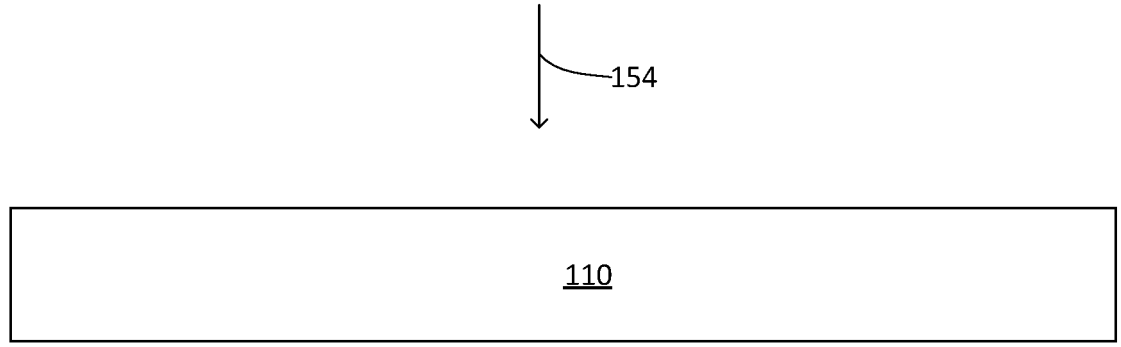
Figure 3F:
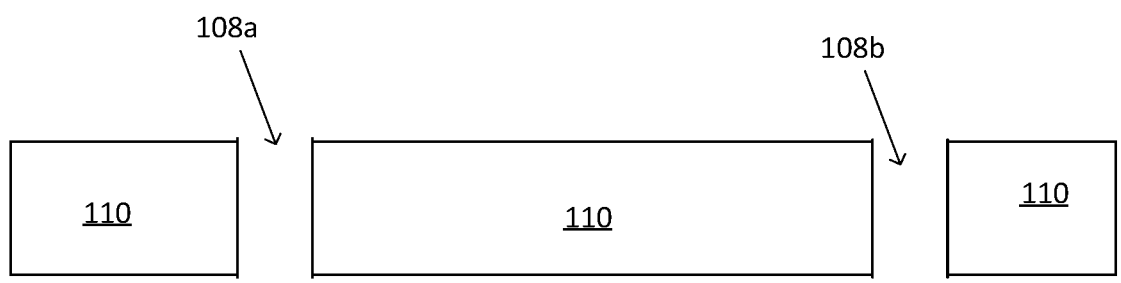

FIGS. 3E-3F depict a board 110, where the board 110 may be exposed to an opening formation process 154 (FIG. 3E), where vent structures 108a, 108b may be formed through the board 110 (FIG. 3F). In an embodiment, the vent structures 108a, 108b may be formed in any suitable location, and may be completely extending through the board 110. The vent structures 108a, 108b, may be located beneath and adjacent to an inductor 104, subsequent to the board 110 being attached to the substrate 102.

Figure 3G:
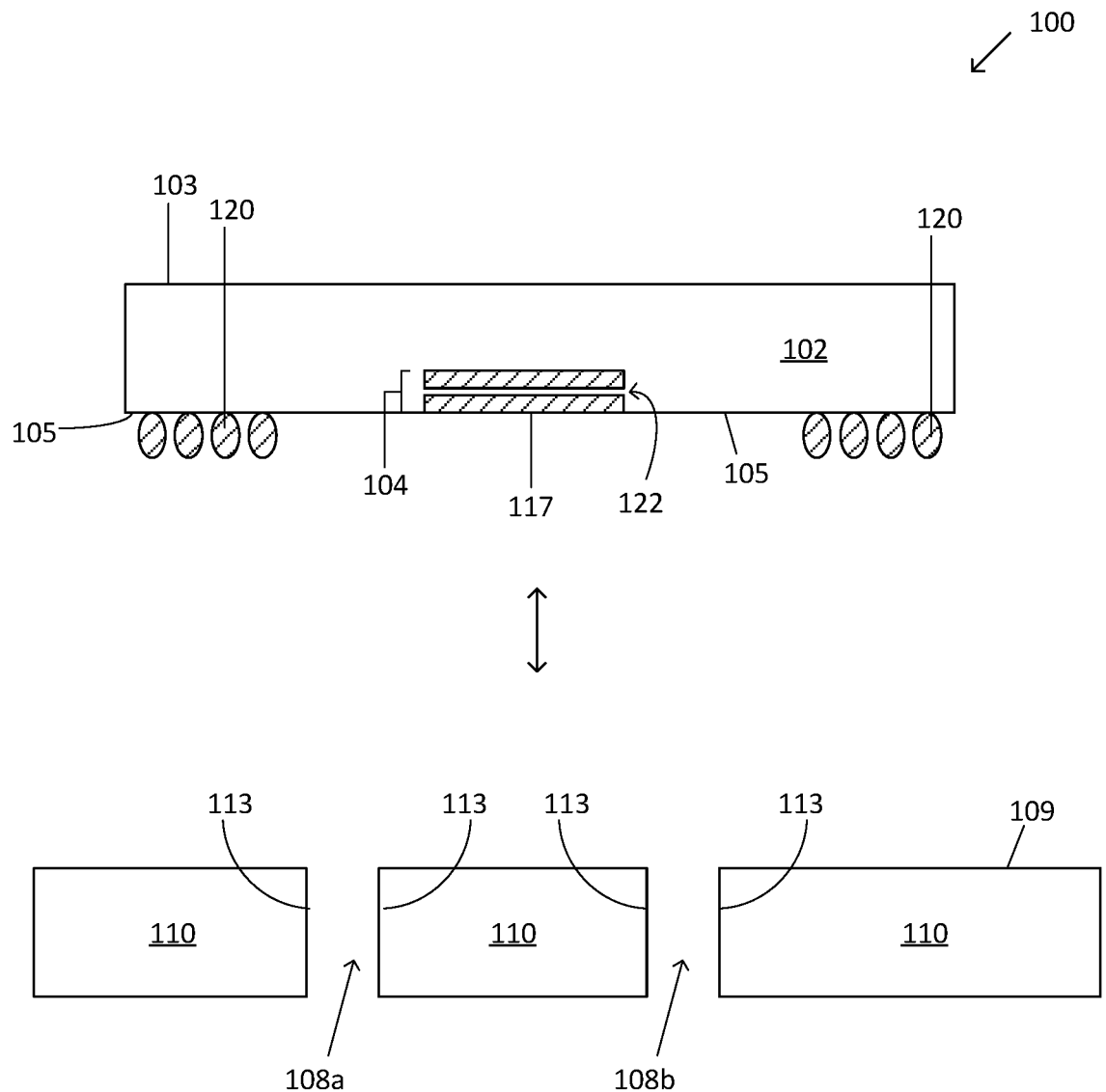

For example, the board 110 comprising board vent structures 108a, 108b, may be attached to the substrate 102 comprising the inductor 104 (FIG. 3G). In an embodiment a die may be attached to the substrate 102 subsequent to the attachment of the board 110. The attachment of the board 110 to the substrate 102 is such that a sidewall 113 of the board vent structures 108a, 108b, are located adjacent to a sidewall 122 of the inductor 104 subsequent to attachment, and wherein solder connections 120 are located adjacent the sidewall 113 of the board vent structures 108a, 108b, in an embodiment. The solder interconnect structures 120 are between the second side 105 of the substrate 102 and the first side 109 of the board 110, in some embodiments.

Figure 3H:
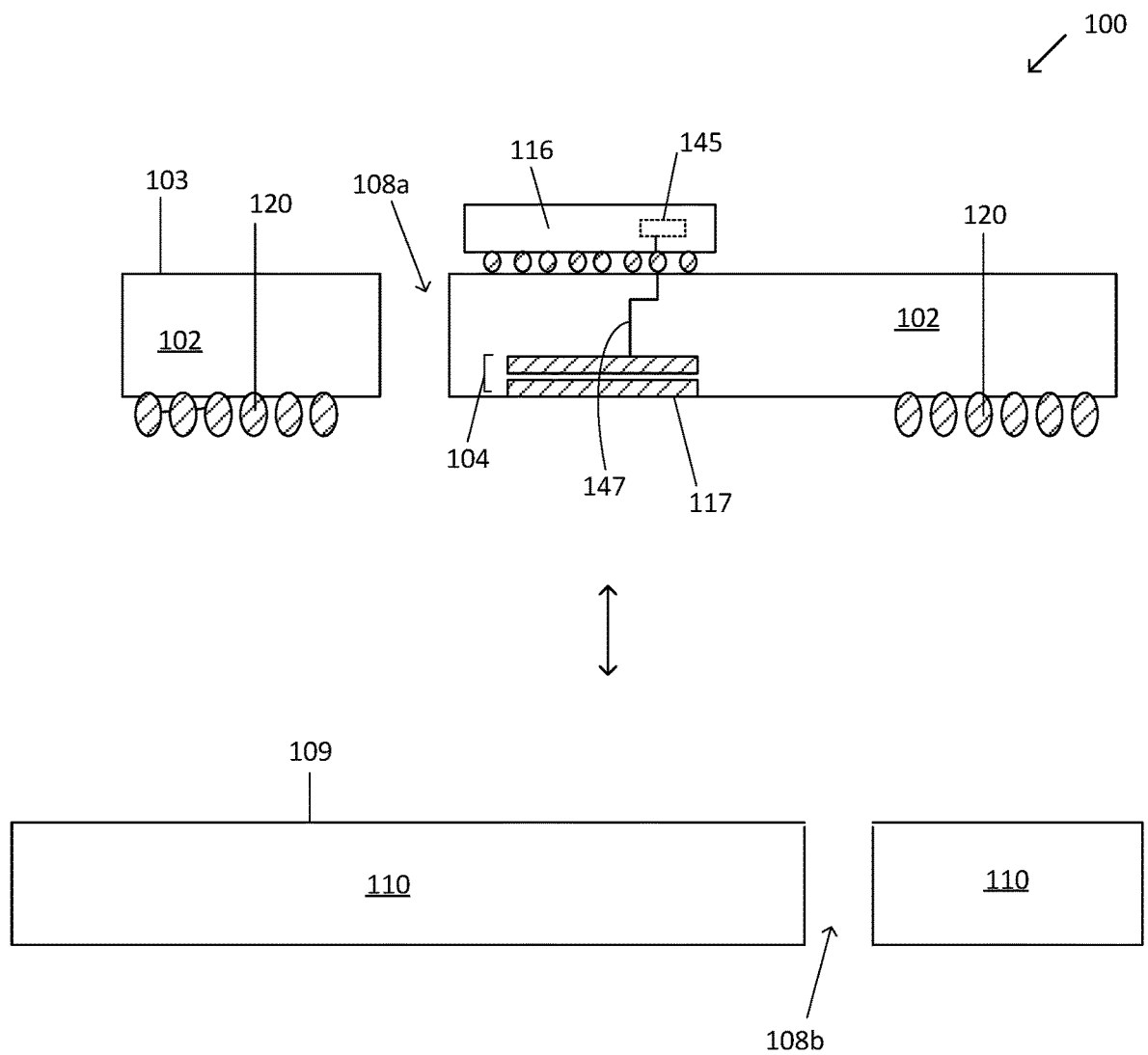

FIG. 3H depicts an embodiment of a package structure 100, comprising a first vent structure 108a extending through the substrate 102, and a second vent structure 108b, extending through the motherboard 110. In an embodiment, the first vent structure 108a is adjacent the inductor 104 on a first side of the inductor, and the second vent structure 108b is adjacent the inductor 104 on a second side of the inductor 104. This configuration allows for an L shaped cooling fluid flow pathway across the inductor 104, where the initial coolant flow arrives through the substrate 102, continues across the inductor 104, within the standoff region between substrate 102 and the board 110, and exits through second vent structure 108b, into the ambient environment. In an embodiment, one or more openings in the substrate 102, and one or more openings in the board 110, may be formed separately, or in a common process operation. In another embodiment, the vent structure 108a, 108b may be initially formed in the substrate 102 and in the board 110, prior to the attachment of the substrate to the board 110. Subsequent to the formation of openings/vent structures 108a, 108b, the substrate 102 may be attached to the board 110. The inductor 104 may be electrically coupled to die 116 voltage regulator circuitry 145 by an electrical/signal trace 147 that is within the package substrate 102.

Figure 3I:
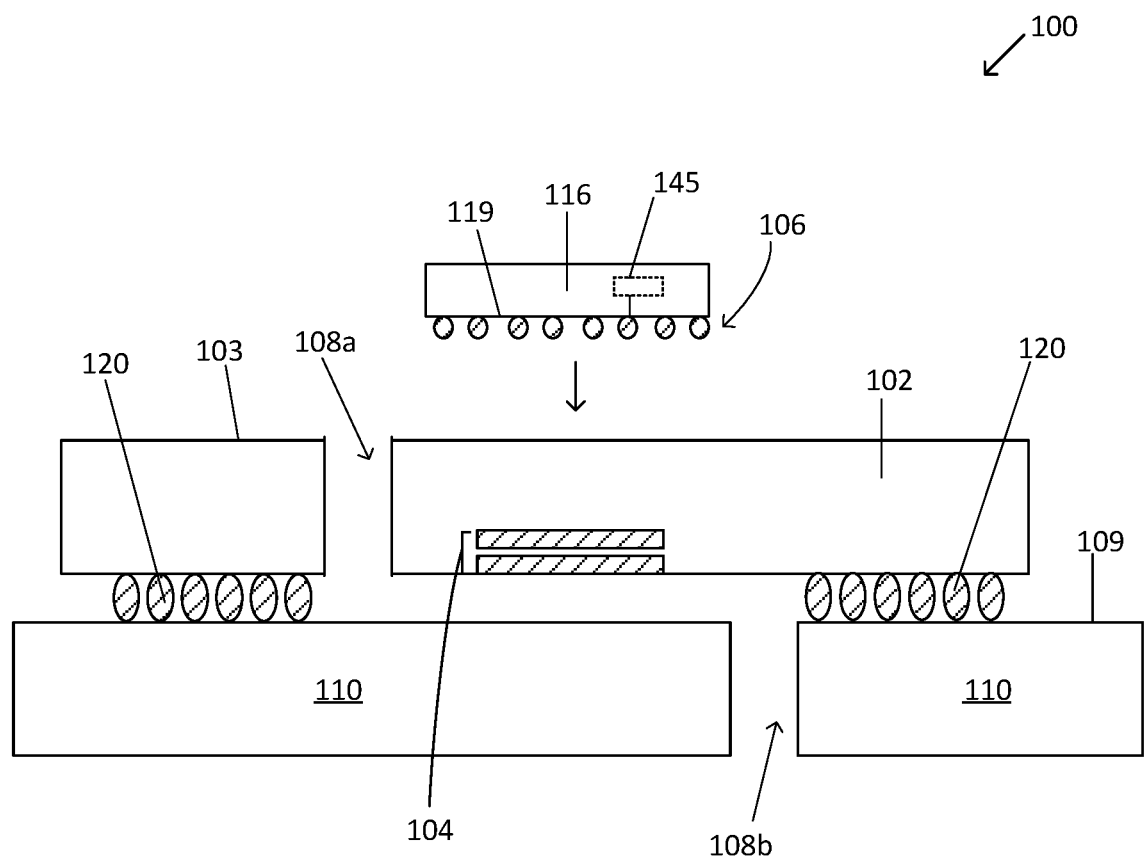

FIG. 3I depicts an embodiment where the substrate 102 may comprise a vent structure 108a, and may be attached to the board 110, which may comprise vent structure 108b. Any number or combination of vent structures 108 may extend through at least one of the substrate 102 or the board 110, and the number and location of the vent structures 108 may be optimized to provide a cooling fluid flow across the inductor 104. In an embodiment, subsequent to the attachment of the substrate 102 to the board 110, the die 116 may be attached to the first side 103 the substrate 102, in an embodiment. The die 116 may be attached over the inductor 104, such that the inductor 104 is within the footprint/die shadow of the die 116. The die 116 may comprise voltage regulator circuitry 145, which may be electrically coupled to the inductor 104 subsequent to the attachment process by electrical/signal traces that are located within the package substrate 102.

A first side 119 of the die 116 is attached to the first side 103 of the substrate 102, where the die 116 may comprise an integrated circuit die, in an embodiment. The die 116 may comprise various types of materials, such as conductive, dielectric and semiconductor materials. The die 116 may include any number of circuit elements, such as any type of transistor elements and/or passive elements. The individual die 116 may comprise n-type and/or p-type transistors, which may include materials such as silicon, germanium, indium, antimonide, lead telluride, indium arsenide, indium phosphide, gallium arsenide, or gallium antimonide, for example. The individual die 116 may include such structures as planar transistors and/or nonplanar transistors, such as FinFET transistors, nanowire transistors or nanoribbon transistors.

The die 116 may be attached to the substrate 102 by using any suitable attachment process, where the plurality of interconnect features 106 on the first side 119 of the die 116, may be joined to interconnect features/pads (not shown) that are on the first side 103 of the substrate 102. Active surfaces of the die 116 may be attached to the first side 103 of the substrate 102, wherein conductive contacts of various integrated circuit devices, such as transistor devices, for example, may be available for connection to the package substrate 102.

Figure 4:
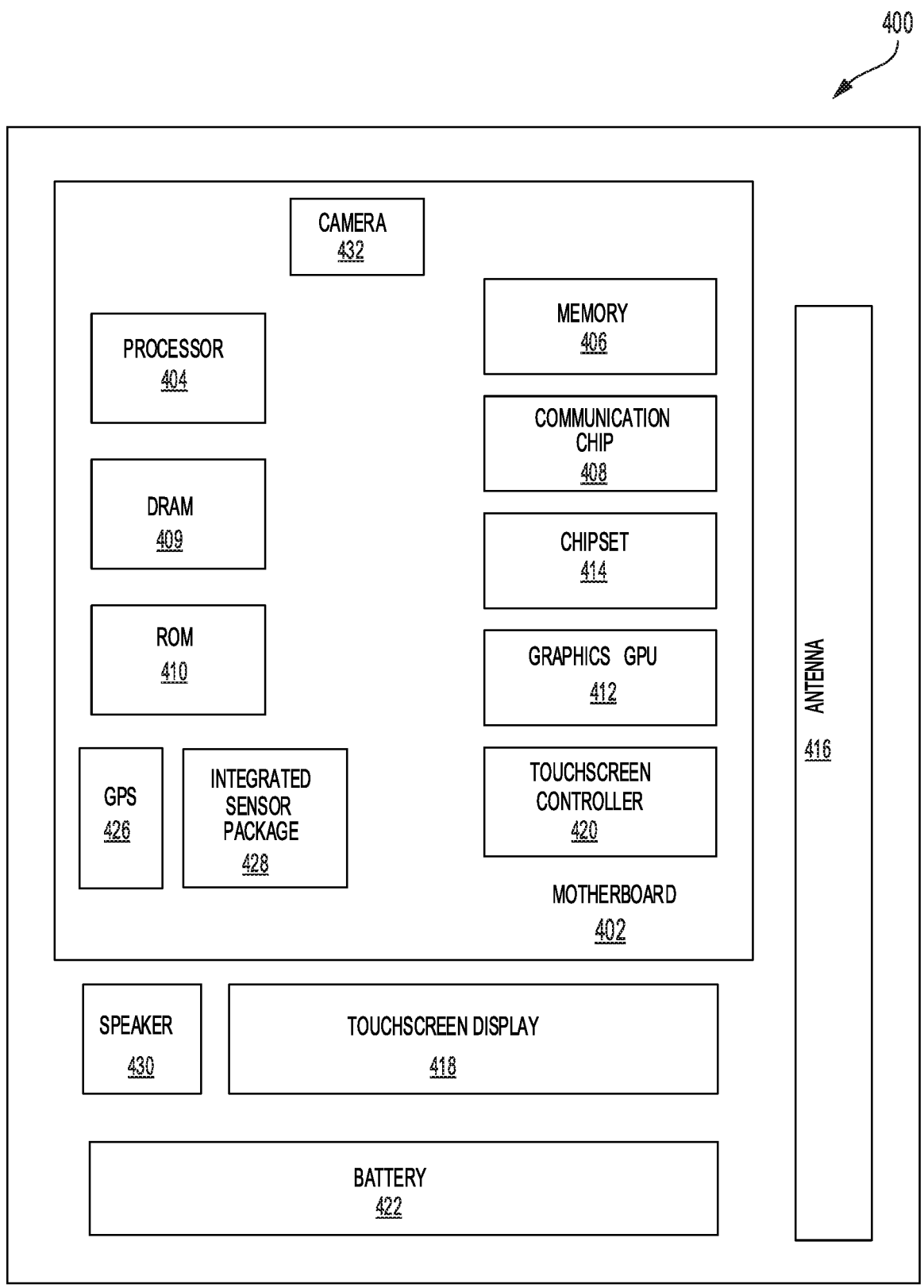
FIG. 4 is a functional block diagram of a computing device employing packaging structures having thermal vent structures, according to embodiments.

FIG. 4 is a schematic of a computing device 400 that may be implemented incorporating the package structures described in any of the embodiments herein comprising thermal vent structures through at least one of the substrate or board, that may provide thermal pathways for cooling an inductor embedded within a package substrate, such as those depicted in FIG. 1F, for example. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, an integrated sensor 428, a speaker 430, a camera 432, an amplifier (not shown), compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A method of fabricating a microelectronic package structure, comprising:
   forming an inductor within a substrate, wherein the inductor is at least partially embedded within the substrate;
   attaching a die on a surface of the substrate;
   forming a substrate opening extending one or more openings vertically through the substrate, wherein the substrate opening is between a first portion of the substrate and a second portion of the substrate, wherein the inductor is within the first portion of the substrate and is within a footprint of the die;
   attaching a board on the substrate; and
   forming a board opening through the board, wherein the board openings is aligned with the substrate opening.

2. The method of fabricating the microelectronic package structure of claim 1, wherein forming the inductor comprises forming a plurality of inductor layers within a recess of the substrate, wherein individual layers are coupled to each other by one or more via structures, and wherein a first side of the inductor is embedded within the substrate, and a portion of a second side of the inductor is substantially coplanar with a second side of the first portion of the substrate.

3. A microelectronic device package structure comprising:
   a substrate comprising a first portion and a second portion;
   a die comprising an integrated circuit, wherein the die is on a first side of the first portion of the substrate;

an inductor, wherein the inductor is at least partially embedded within the substrate; and a substrate openings extending vertically through the substrate between the first portion and the second portion, wherein the substrate openings is adjacent a sidewall of the inductor, wherein a board comprises a board opening extending vertically through the board, wherein the board opening is aligned with the substrate opening.

4. The microelectronic device package structure of claim 3, wherein a heat sink is on the die and is thermally coupled to the die, wherein the heat sink comprises an opening extending through the heat sink, and wherein the opening through the heat sink is over the substrate opening.

5. The microelectronic device package structure of claim 3 wherein an air funnel is adjacent the die and on the first side of the first portion of the substrate, and a fan is adjacent the air funnel.

6. The microelectronic device package structure of claim 3, wherein the inductor comprises a portion of an air core inductor.

7. The microelectronic device package structure of claim 3, further comprising a board electrically coupled to the second side of the substrate.

8. The microelectronic device package structure of claim 7, wherein one or more interconnect structures are on a first side of the board, wherein the one or more interconnect structures are adjacent a sidewall of the board opening.

9. An assembly comprising:
a substrate, the substrate comprising a first side and a second side opposite the first side, wherein the substrate comprises a first portion and a second portion;
a die on the first side of the first portion of the substrate, the die comprising an integrated circuit;
an inductor, wherein the inductor is at least partially embedded within the first portion of the substrate, and is within a footprint of the die;
a board electrically coupled to the second side of the substrate; and
an opening between the first portion and the second portion of the substrate, wherein the opening extends vertically from the first side of the substrate to a first side of the board, and
wherein the openings is adjacent a sidewall of the inductor.

10. The assembly of claim 9 wherein the inductor comprises an air core inductor, wherein the air core inductor comprises one or more conductive layers coupled to each other by one or more conductive via structures.

11. The assembly of claim 9, wherein a first side of the die is on the first side of the substrate, and wherein a heat sink is on a second side of the die, and wherein the heat sink has an opening adjacent the die.

12. The assembly of claim 9, wherein the die includes a portion of a voltage regulator, and wherein the inductor is electrically coupled to the voltage regulator.

13. The assembly of claim 9, wherein an air funnel is on the first side of the substrate, adjacent the die.

14. The assembly of claim 9, wherein an array of solder balls surrounds the die on a first portion of a peripheral region of the second side of the substrate, and wherein a second portion of the peripheral region of the second side of the substrate is free of the solder balls.

15. The assembly of claim 14, wherein the openings is between the array and the die.

16. The assembly of claim 9, wherein one or more interconnect structures are on a second side of the second portion of the substrate, adjacent a sidewall of the openings.

17. The assembly of claim 16, wherein a stand-off region is between the second side of the first portion of the substrate and a first side of the board, wherein a portion of the standoff region beneath the inductor is free of the one or more interconnect structures, and wherein a first side of the inductor is embedded within the substrate, and a second side of the inductor is substantially coplanar with the second side of the substrate.

* * * * *